United States Patent [19]
Faulkner et al.

[11] Patent Number: 5,760,650
[45] Date of Patent: Jun. 2, 1998

[54] COPLANAR WAVEGUIDE AMPLIFIER

[75] Inventors: Mark V. Faulkner, Boulder Creek; Clifford A. Mohwinkel, San Jose, both of Calif.

[73] Assignee: Endgate Corporation, Sunnyvale, Calif.

[21] Appl. No.: 731,196

[22] Filed: Oct. 7, 1996

Related U.S. Application Data

[63] Continuation-in-part of Ser. No. 662,693, Jun. 12, 1996, Pat. No. 5,668,512, which is a continuation-in-part of Ser. No. 478,375, Jun. 7, 1995, Pat. No. 5,528,203, which is a continuation of Ser. No. 313,927, Sep. 26, 1994, abandoned.

[51] Int. Cl.⁶ .................................................. H03F 3/60
[52] U.S. Cl. .................................................. 330/286
[58] Field of Search .......................... 330/56, 286, 287; 333/128, 247

[56] References Cited

U.S. PATENT DOCUMENTS

| | | |
|---|---|---|
| 4,183,041 | 1/1980 | Goel . |
| 4,250,520 | 2/1981 | Denlinger . |
| 4,267,520 | 5/1981 | Derewonko et al. . |
| 4,376,287 | 3/1983 | Sechi . |
| 4,587,541 | 5/1986 | Dalman et al. ............... 330/277 X |
| 4,614,915 | 9/1986 | Heston et al. . |
| 4,658,220 | 4/1987 | Heston et al. . |
| 5,087,896 | 2/1992 | Wen et al. . |
| 5,105,171 | 4/1992 | Wen et al. . |
| 5,115,245 | 5/1992 | Wen et al. . |
| 5,172,074 | 12/1992 | Shiga . |
| 5,227,738 | 7/1993 | Shiga . |
| 5,357,212 | 10/1994 | Kohno . |
| 5,363,060 | 11/1994 | Kohno . |
| 5,406,224 | 4/1995 | Mikami et al. . |
| 5,550,518 | 8/1996 | Mohwinkel . |

*Primary Examiner*—James B. Mullins
*Attorney, Agent, or Firm*—Steven J. Adamson; Edward B. Anderson

[57] ABSTRACT

An amplifier including an amplifying transistor flip-mounted on a coplanar waveguide pattern. Elements of stability and/or matching circuits are provided at least in part under the flip-mounted transistor to facilitate compact design and to improve component performance. A serial resistor-shunt inductor pair is provided with the resistor coupled proximate the transistor input and/or output and preferably configured within the CPW center conductor to provided more consistent component values. Embodiments of the present invention include a two-stage amplifier having a transmission segment formed between the two stages which serves to rotate the output impedance of the first stage toward a low noise match with the second stage and to rotate the input impedance of the second stage toward a high gain match with the first stage. The transmission segment may include a capacitive element for providing series capacitance and DC blocking. Adjustable impedance matching means are also taught.

29 Claims, 2 Drawing Sheets

COPLANAR WAVEGUIDE AMPLIFIER

CROSS REFERENCE TO RELATED APPLICATIONS

This application is a continuation-in-part of U.S. patent application Ser. No. 08/662,693, filed Jun. 12, 1996, now issued as U.S. Pat. No. 5,668,512, which is a continuation-in-part of U.S. patent application Ser. No. 08/478,375 filed Jun. 7, 1995 now issued as U.S. Pat. No. 5,528,203, which is a continuation of U.S. patent application Ser. No. 08/313,927, filed Sept. 26, 1994, now abandoned.

FIELD OF THE INVENTION

The present invention relates primarily to low noise amplifiers, but is also applicable to other types of amplifiers, including power amplifiers. More specifically, the present invention relates to providing a compact design and improved performance in such amplifiers.

BACKGROUND OF THE INVENTION

Low noise amplifiers are known and are often used where it is desired to extract a signal from surrounding noise. An input to a receive channel that is tuned for a modulated signal is an example, amongst others, of where a low noise amplifier may be used.

Prior art low noise amplifiers include those formed in microstrip transmission media. Microstrip amplifiers are disadvantageous for many reasons, including that they require metalization on both sides of a substrate and the formation of interconnecting vias therebetween. In addition, transmission line impedance in microstrip devices is dependant on substrate thickness, which constrains mechanical packaging requirements and limits impedance range.

Other relevant features of prior art low noise MMIC amplifiers include that they tend to be disadvantageously consumptive of chip area. Amongst other considerations, the more compact a design, the more devices that can be produced per wafer. Conventional amplifier also use unnecesary impedance transformations. For example, in serial inductor-resistor patterns, a bond wire inductor/transmission line connected in the signal path and preceding the resistor transforms the impedance of the resistor. It should also be recognized that adequate adjustability for characteristic variations in material, such as impedance variations in amplifying transistors, is not found in prior art low noise amplifiers.

SUMMARY OF THE INVENTION

Accordingly, it is an object of the present invention to provide an amplifier that is implemented in coplanar waveguide transmission media.

It is another object of the present invention to provide a compact design for an amplifier, including using substrate area under a flip-mounted amplifying device for circuit components.

It is another object of the present invention to provide a compact design for an amplifier, including combining elements which provide impedance matching with bias insertion and blocking elements thus reducing the size.

It is another object of the present invention to provide an amplifier with enhanced, more predictable stability.

It is another object of the present invention to provide an amplifier with adjustable impedance matching.

And it is another object of the present invention to rotate maximum gain impedance of a preceding stage to the minimum noise impedance of a succeeding stage in a coplanar waveguide amplifier.

These and related objects of the present invention may be achieved by the amplifier disclosed herein, in which an amplifying transistor is flip-mounted on a coplanar waveguide pattern formed on a heat sinking substrate. Elements of stability and/or matching circuits such as source lead inductors may be provided under the flip-mounted transistor to facilitate compact design and improve component performance by placing the components closer to the amplifying transistor.

Amongst other aspects of the present invention, a mechanism for adjusting impedance to facilitate the submission of $\Gamma_{opt}$ to the amplifying transistor is provided. A resistor-shunt inductor/transmission line pair is provided between the amplifying transistor input and signal return in such a manner that the resistor is coupled proximate the input. A DC bias may be provided through this pair.

Embodiments of the present invention include a two stage amplifier comprising a transmission segment formed between the two stages which serves to rotate the output impedance of the first stage toward a low noise match with the second stage and to rotate the input impedance of the second stage toward a high gain match of the first stage. Means are provided for providing $\Gamma_{opt}$ to the first input stage. The transmission segment may include a capacitive element for providing series capacitance and DC blocking.

The attainment of the foregoing and related advantages and features of the invention should be more readily apparent to those skilled in the art, after review of the following more detailed description of the invention taken together with the drawings.

DETAILED DESCRIPTION

Figure 1:
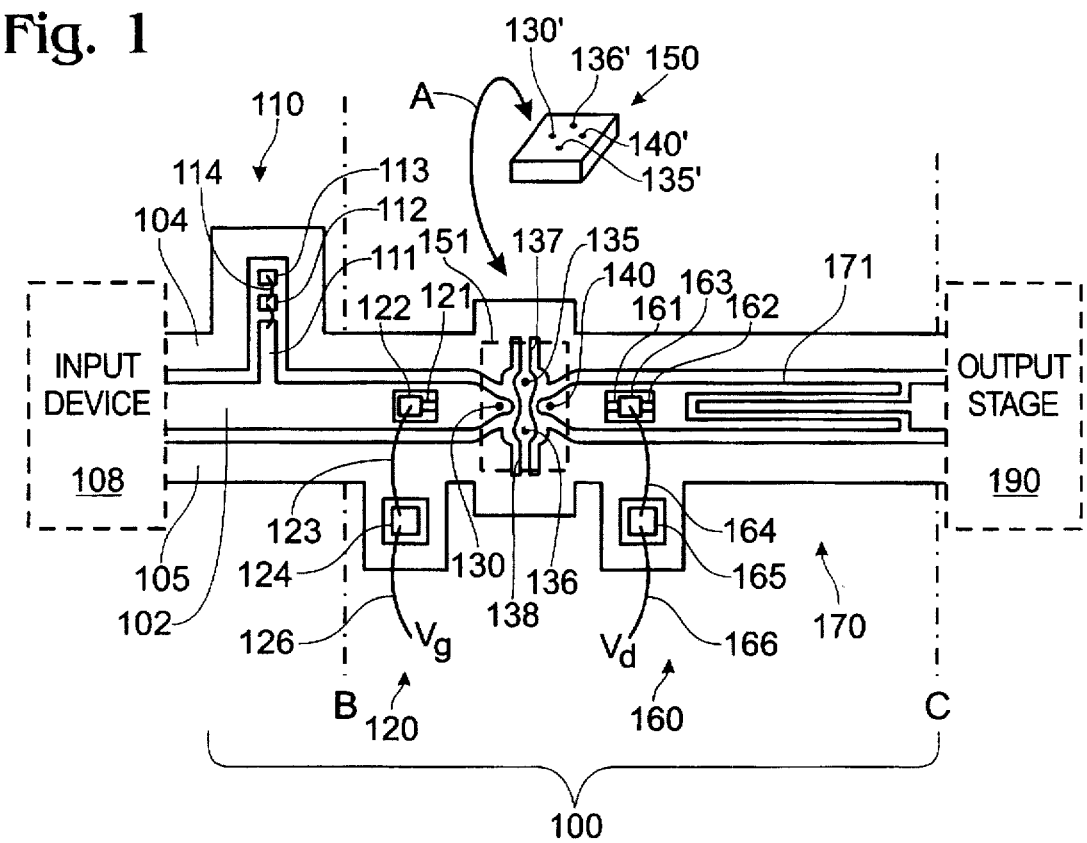
FIG. 1 is a diagram of an amplifier in accordance with the present invention.

Referring to FIG. 1, an amplifier 100 in accordance with the present invention is shown. Amplifier 100 is formed in coplanar waveguide (CPW) transmission media. The CPW implementation includes a center conductor 102 and two flanking conductors 104,105 preferably configured in strip format. Use of CPW strips 104,105 as opposed to a conventional ground plane provides a more compact design, amongst other benefits, though it should be recognized that the use of conventional ground planes in connection with an amplifier as taught herein is within the present invention. Amplification is provided by an amplifying transistor 150 that is preferably flip-mounted. It should be recognized that while the present invention involves low noise amplification, it also includes power amplification, amongst other amplifier types. The primary discussion is directed towards low noise amplifiers, through modifications to achieve power amplification are discussed as appropriate.

An input of amplifier 100 is coupled to any input device 108 from which low noise amplification is desired. Possible input devices include, but are not limited to, a diplexer, mixer, filter, antenna, etc. For power applications, the input of amplifier 100 is coupled to any input device 108 from which power amplification is desired.

Stub 110 is provided for matching the impedance submitted by input device 108 to $\Gamma_{opt}$ (for lowest noise or power, depending upon application) of amplifier 100 over the frequency range of interest. Stub 110 includes a primary stub 111 and stub extending pads 112,113 spaced therefrom. Pads 112,113 permit impedance adjustments to compensate for inherent variations in the impedance of GaAs and like devices. Leads 114, illustrated in dashed lines, may be provided from primary stub 111 to pad 112 or pads 112,113 to extend the effective length of primary stub 111, if desired, to improve the impedance match.

The decision on whether to use contact pads 112,113 may be made analytically or empirically. Analytically, the resultant amplifier is characterized, i.e., S parameters are generated, and the characteristics are input to a simulation program (such as the Mimicad software package of Optotek, Inc.) to analyze performance and impedance match. Empirically, pads 112,113 are serially connected by leads and then the leads are sequentially severed. Noise and gain measurements are produced for each configuration and compared. It should be recognized that although stub 110 is illustrated at the input, it could be used for impedance matching at an amplifier output and for matching to $\Gamma_{opt}$ for power if so desired.

Transistor 150 is preferably a GaAs field effect transistor (FET) that is flip-mounted on a CPW metalization pattern which includes gate, source and drain electrodes. It should be recognized that nonmetallic conductive material may be used in place of metal. The gate electrode 130 and drain electrode 140 are formed in center conductor 102 and source electrodes 135,136 are coupled to signal return conductive strips 104,105. The electrodes 130,135,136,140 are contact areas in the CPW metalization pattern on which the corresponding terminals of the amplifying transistor 150 are mounted. The corresponding terminals of amplifying transistor 150 respectively include contact areas 130',135',136', 140'. Flip-mounting FET 150 minimizes and makes more consistent parasitic lead inductance, amongst other benefits. Techniques for flip-mounting a chip are known in the art and include gold-gold thermocompression. The gate electrode 130 is effectively the input electrode and the input signal is the voltage difference between gate and source voltages. The drain electrode 140 is effectively the output electrode and the output signal is the voltage difference between the drain and source voltages.

An LCR circuit 120 is connected to gate electrode 130 to effectively provide band pass filtering which in turn enhances stability. LCR circuit 120 includes a resistor 121 which is formed in center conductor 102 immediately proximate the gate electrode. Resistor 121 may be formed as close to the gate electrode as photolithographic tolerances permit. An inductor/transmission line lead 123 (hereinafter referred to as inductive lead 123) is serially connected to resistor 121 through contact pad 122. This lead 123 effectively shunts signals below a cutoff frequency through resistor 121 to signal return or ground and is preferably approximately one quarter of a design wavelength in length. Contact pad 124 is capacitively coupled to signal return strip 105 and lead 126 permits the delivery of a DC bias voltage to the gate. Placing resistor 121 proximate gate electrode 130 and in such a manner that it serially precedes inductive lead 123 eliminates a transformation of the resistor impedance that would otherwise occur if the inductor serially preceded the resistor. As used herein, the phrase serially precedes is intended to mean that the resistor occurs before the inductor in the signal path from the center conductor to signal return.

Resistor 121 is preferably formed as part of a layer of tantalum nitride or like material between the metalization layer and substrate. The use of tantalum nitride in connection with forming metalized circuit on a ceramic or like substrate is known in the art.

The source electrodes 135,136 are coupled through inductive traces 137,138, respectively, to signal return conductive strips 104,105. These inductive traces provide stability feedback to the input of amplifier 100. Traces 137,138 also translate $\Gamma_{opt}$ on a Smith chart towards the complex conjugate of $S_{11}$ to achieve an input impedance match. The appropriate size of traces 137,138 can be determined by simulation of source inductance or through empirical measurements of source inductance.

The chip containing transistor 150 is mounted onto the illustrated metalization pattern by flipping the chip in the direction indicated by Arrow A. Dashed line 151 illustrates the location or "footprint" of the mounted transistor. When mounted, circuit components are provided on two substantially planar layers which overlap. A first of these layers is that which contains the components in chip 150 and a second is that which contains the components in the CPW metalization pattern. Overlapping is achieved by forming components in the CPW metalization pattern, for example, source inductive traces 137,138, such that they are, such covered by the flip-mounted transistor. In other words, when one looks in a plan view (usually from above) at the transistor mounted on the metalization pattern, these components are obscured from view by the flip-mounted transistor. Provision of overlapping multi-level componentry reduces the amount of requisite substrate area. Overlapping multi-level componentry also permits the realization of component values that are less affected by parasitics because the components are connected directly to the contact areas 130', 135', 136', 140' of the amplifying transistor 150. Dashed line 151 indicates the area of overlap.

The drain electrode 140 is also connected to an LCR circuit 160. LCR circuit 160 includes two resistors 161, 162 arranged in parallel in center conductor 102. Though parallel resistors are shown here, it should be recognized that utilization of resistors is application dependent and hence, none, one, or serial or parallel resistors could be provided. An inductive lead 164 serially connects to resistors 161,162 through contact pad 163 and is preferably approximately one quarter of a design wavelength in length. Contact pad 165 is capacitively coupled to single return conductive strip 105 and lead 166 permits delivery of a DC bias voltage to the drain. Resistance is preferably implemented with the two parallel resistors 161,162 to achieve an effective resistance that is less than that provided at gate electrode 130. The resistive value at the gate is preferably higher than that at the drain to minimize power loss at the input. In power applications, this drain resistive value is made small to minimize DC bias voltage drop. Placement of resistor 161, 162 proximate the drain electrode 140 and up-stream of inductive lead 164 provides the advantages discussed above with reference to LCR circuit 120.

The length of CPW transmission line from drain electrode 140 to an input of output stage 190, including the length of conductor encompassing resistors 161,162 and distributed capacitor 171, forms a impedance matching network or transmission segment 170. Changes in length of this transmission segment 170 correspond to impedance rotation on a Smith chart. For low noise applications, it is desirable to establish a length which rotates the output impedance of transistor 150 such that output stage 190 sees an impedance match for low noise. It is also desirable to establish a length which rotates the input impedance of output stage 190 such that transistor 150 sees an impedance match for highest gain.

A compromised length which corresponds to a point on the Smith chart between lowest noise and highest gain impedance may be selected if both low noise and high gain performance are desired. Use of a transmission segment 170 to achieve desired impedance matching facilitates a compact design.

The provision of distributed capacitor 171 induces a series capacitance in transmission segment 170 such that the segment does not function as a pure transmission line. The inclusion of series capacitance in segment 170 achieves the desired impedance rotation in a shorter length of transmission line than required without series capacitance, hence resulting in a more compact amplifier design. The provision of series capacitance in this manner is generally known in the art. Distributed capacitor 171 also provides DC blocking. Though a distributed capacitor is preferred, a lumped capacitor such as a ceramic or chip capacitor or the like could be used. The length of transmission segment 170 is preferably determined using field solving software.

Output stage 190 may be any output device, including a transmission line, mixer, second stage amplifier, etc. When output stage 190 is a second stage transistor amplifier, the components between dot-dash lines B and C are preferably repeated in output stage 190 and the resultant 2-stage amplifier may be configured as a high gain engine. A high gain engine is a special case of the 2-stage embodiment in which the transmission segment between the two transistors, Q1 and Q2 (150 and 190, respectively), matches the complex conjugate of Q2 input impedance ($\Gamma_{in}$*) to $\Gamma_{out}$ of Q1 with substantially minimum trajectory and minimum loss. When the impedance submitted to Q1 is $\Gamma_{opt}$ (though not limited to $\Gamma_{opt}$), $\Gamma_{out}$ of Q1 is low and near $\Gamma_{in}$ of Q2. This means that the impedance matching component between Q1 and Q2 can be implemented relatively simply, for example, as an inductor or transmission line (170). If $\Gamma_{out}$ of Q1 is too large, it can be reduced by increasing the gate width of Q1 relative to that of Q2. If $\Gamma_{out}$ of Q1 is too small, it can be increased by reducing the gate width of Q1 relative to that of Q2.

With standard leaded devices or chip and wire at microwave and millimeter wave frequencies, the actual $\Gamma_{out}$ is far from $\Gamma_{in}$. The very low parasitics associated with the CPW flip-chip embodiments taught herein, however, permit realizing an output of Q1 and an input of Q2 where $\Gamma_{out}$ is approximately equal to $\Gamma_{in}$.

In one embodiment for a two-stage amplifier in accordance with the present invention, the design parameters are as follows. Starting information includes a selection of devices for amplifying transistors 150,190 each having a gate width×gate length of 100×0.2 µm and the knowledge that a transmission segment of one quarter of a design wavelength achieves a rotation of 180 degrees on a Smith Chart. The impedance to be presented to the output of the first stage is $S_{22}$* (with the input terminated in $\Gamma_{opt}$). For the specified device having a gate width of 100 µm, the Smith Chart impedance value is 0.48∠85 degrees. The impedance to be presented to the input of the second stage is $\Gamma_{opt}$ for low noise. For the specified device, this value is 0.25∠79 degrees. Transmission segment 170 can transform the input impedance of the second stage transistor 190 ($S_{11}$) into $S_{22}$* for the first stage transistor 150 by rotating counter clockwise around the Smith Chart for 0.48∠85 degrees to $S_{11}$. Similarly, transmission segment 170 can transform the output impedance of $S_{22}$ of the first stage transistor into $\Gamma_{opt}$ presented to the second stage transistor by rotating clockwise around the Smith Chart from 0.5∠265 degrees ($S_{22}$) to 0.25∠79 degrees ($\Gamma_{opt}$). In the present case, $\Gamma_{opt}$ and $S_{22}$* cannot be achieved simultaneously. The cascade noise figure calculation helps to determine which variable to optimize for lowest cascade noise figure, gain for the first stage or noise for the second stage.

The cascade noise figure is defined as:

$$NF_{cascade}=NF_1+(NF_2-1)/g_1+(NF_3-1)/g_1g_2+\cdots$$

where $NF_1$=NF of first stage amplifier 150 and $g_1$=gain of first stage amplifier 150. The partial derivative of the expanded series provides:

$$\partial NF_{cascade}/\partial g_1 \approx \partial NF_{cascade}/NF_2.$$

Since these values are approximately equal, an impedance may be chosen between the $\Gamma_{opt}$ and $S_{22}$* which achieves an impedance rotation that is off by approximately 0.1 in magnitude and 25 degrees in angle for both gain and noise. The resultant values are 0.61∠61 degrees for first stage gain and 0.15∠105 degrees for second stage noise.

In an embodiment for a 2-stage (or multi-stage) power amplification, the length of the transmission segment 170 is selected to rotate the input impedance of a second amplifier (190) so that a preceding amplifier (150) sees an impedance match for power, gain or noise depending on what is desired.

Selections of a desirable transmission segment length for low noise or power applications can be achieved by use of a Smith Chart and field solving software using techniques known in the art. The function of a device layout can be ascertained by measuring electrical performance, including measuring the circuit for noise figure.

It should be recognized that the transmission segment and first and second stage amplifying devices in low noise and power amplifiers could be provided within a flip-mounted chip, as an alternative to being implemented as illustrated in the figures herein. Suitable techniques for their fabrication in a semiconductor substrate are known in the art.

With respect to material for fabricating the amplifier of FIG. 1, the conductive components discussed above are preferably made of gold (Au) which is known for its desirable thermal and electrical conductivity. These components are formed on a heat sinking substrate (not shown) such as BeO as is known in the art.

Figure 2:
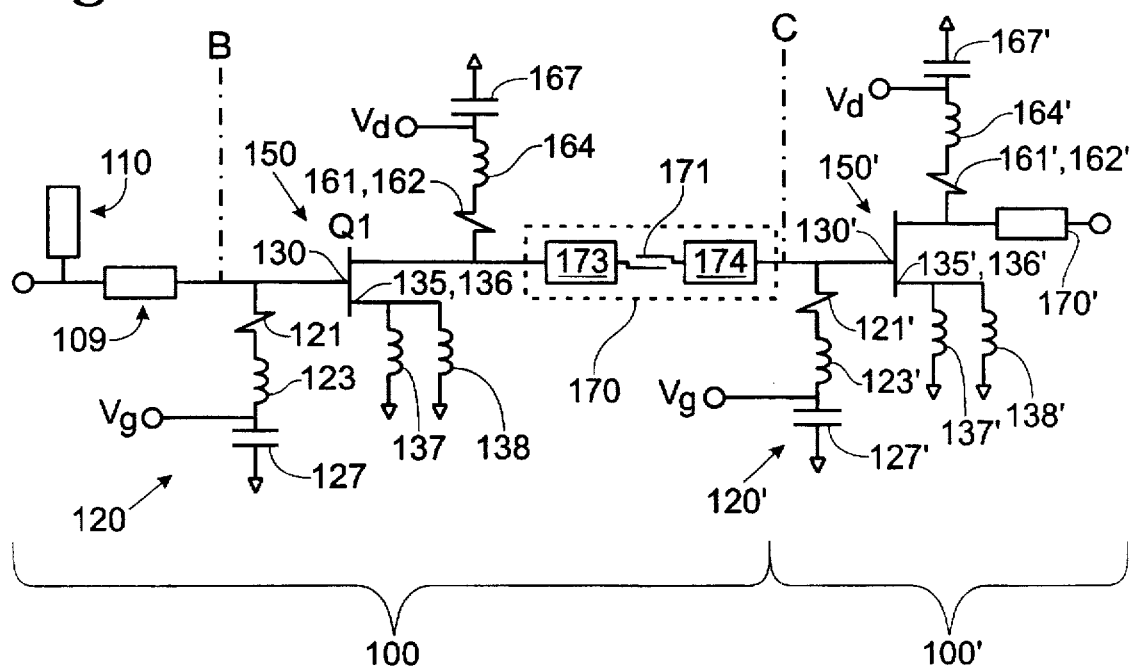
FIG. 2 is a schematic diagram of the amplifier of FIG. 1.

Referring to FIG. 2, a schematic diagram of amplifier 100 of FIG. 1 with a second stage amplifier 100' (analogous to output stage 190) coupled thereto is shown. Symbol 110 represents stub 110 and symbol 109 represents the transmission segment between stub 110 and gate electrode 130. LCR circuit 120 includes resistor 121, inductor 123, Vg bias voltage and capacitor 127. Inductive traces 137,138 which are covered by flip-mounted transistor 150 are represented schematically as inductors connected to the source 135,136 of FET 150. Drain LCR circuit 160 includes resistors 161,162, inductor 164, Vd bias voltage and a capacitor 167. The transmission segment 170 indicated by dashed line includes impedance matching components 173,174 which are characterized by the length of the segment as discussed above and distributed capacitor 171.

The second stage amplifier 100' has components analogous to those between dot dashed lines B and C of amplifier 100. The analogous components are labelled with the same reference numbers accompanied with a prime symbol ('). It should be noted that symbol 170' represents components for output impedance matching and the makeup of components therein may differ depending on the type of device connected at the output. For example, symbol 170' may represent the effects represented by symbols 109 and 110, or 173 and 174 with or without distributed capacitor 171, or the like.

Figure 3:
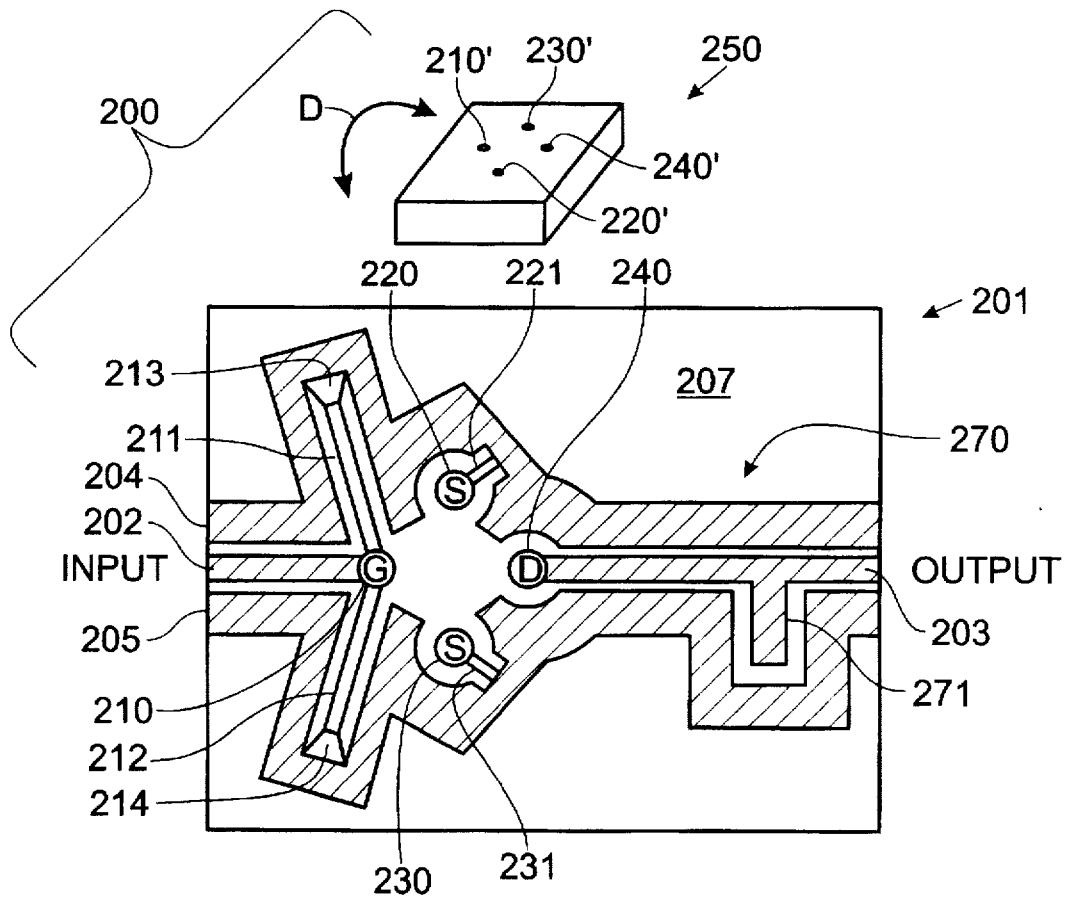
FIG. 3 is a diagram of another amplifier in accordance with the present invention.

Referring to FIG. 3, a diagram of another amplifier 200 in accordance with the present invention is shown. Amplifier 200 is preferably formed in CPW strip as discussed above and includes a flip-chip transistor 250 that is mounted onto a substrate 207 as indicated by Arrow D.

Gate electrode 210, two source electrodes 220, 230 and a drain electrode 240 are formed in the CPW pattern formed on substrate 207. Gate electrode 210 is connected to an input center conductor 202 and drain electrode 240 is connected to an output center conductor 203. Electrodes 210, 220, 230, 240 and input and output center conductors 202,203 are flanked by conductive strips 204,205, analogous to strips 104,105 discussed above. Circular or other shaped wells may be formed in the conductive strips about each electrode to facilitate flip-chip 250 alignment. Gate electrode 210 is coupled through two serially arranged inductor-resistor pairs, including inductors 211,212 and resistors 213,214, to conductive strips 204,205. With the topology of the amplifier of FIG. 3, the inductors precede the resistors for low noise applications. Source electrodes 220 and 230 are respectively connected through inductive traces 221 and 231 to conductive strips 204,205. Output center conductor 203 includes an impedance matching stub 271. As in the embodiment of FIG. 1, these components are preferably formed of gold.

Flip-chip transistor 250 is preferably a GaAs FET. Though the use of other transistors is contemplated, FETs are preferred for higher frequency applications. Transistor 250 includes contacts 210',220',230',240' for respectively mounting to the gate, source and drain electrodes.

The length of transmission segment 270 and the length of stub 271 provide output impedance matching. Stub 271 provides capacitance a fixed distance from the drain electrode which facilitates matching to the characteristic impedance of an output device (not shown). Note that stub 271 could be adjustable like stub 110 discussed above.

Figure 4:
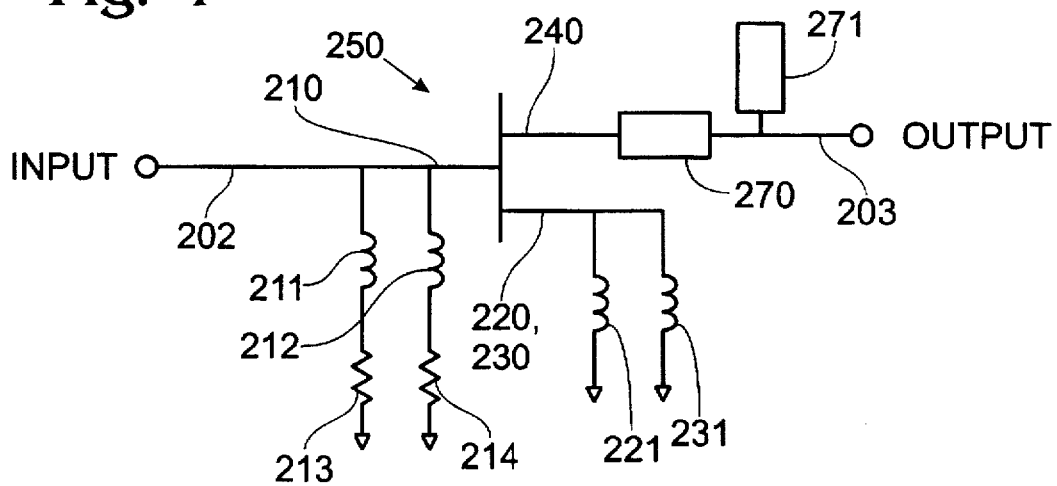
FIG. 4 is a schematic diagram of the amplifier of FIG. 3.

Referring to FIG. 4, a schematic circuit diagram for amplifier 200 is shown. Input center conductor 202 is connected to the gate electrode 210 of FET 250. Gate electrode 210 is connected through inductors 211,212 and resistors 213,214 to signal return or ground (conductive strips 204,205). Source electrodes 220,230 are connected through inductors 221,231 to signal return or ground. Drain electrode 240 is connected to output center conductor 203 (encompassed in transmission segment 270). Symbols 270 and 271 represent transmission line segment 270 and stub 271, respectively.

Stability and Related Considerations

In a preferred configuration, amplifiers 100,200 are utilized in the front end of a receive channel. In this capacity, it is advantageous that the amplifiers be stable and have a low signal to noise ratio, in addition to providing maximum gain without unacceptably increasing noise. The transmission lines, inductors and capacitive elements define the amplifying band of each amplifier. Frequencies below a desired amplification frequency are dissipated or reflected by the resistive or reactive elements. Frequencies above a desired amplification frequency are less significant because oscillation is proportional to gain and gain is reduced at higher frequencies as is known.

The selection of appropriate values for the shunt inductors, resistors and capacitors discussed above depends on the devices used, source or load impedance, stability requirements, frequency band of operation, operating impedance and slope requirement. The stability factor, K, is used as a measure of stability and depends upon resistance values, device S parameters and impedance matching as is known in the art. A value of K>1 indicates unconditional stability.

The values for the inductors and resistors are preferably selected theoretically (through use of Smith charts, computer programs and related information) and then confirmed empirically. Suitable software for theoretical calculation includes the Mimicad software program from Optetek, Inc., and the Touchstone software programs from Eesof, Inc., which are both linear simulator programs. An electromagnetic field solver such as the IE3D software program from Zeland Software of San Francisco, Calif., permits application to CPW configurations. With respect to empirical analysis, it should be recognized that deviation from theoretical values are expected due to parameter variation, stray capacitances, and other random causes.

With respect to resistor values, care should be exercised in their selection because although they dissipate unwanted frequencies, they consume power and excessive power consumption may result in loss of faint signals. With respect to the location of resistive elements, it should be recognized that other resistive arrangements are contemplated including placement in series with the input signal and in series with the source to ground connection, etc.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

We claim:

1. An amplifier, comprising:

an electrically insulating substrate having a planar surface;

a CPW pattern formed on said surface having at least first and second centerline sections physically separated from one another and positioned between first and second signal return conductors, said first section containing an input electrode and said second section containing an output electrode;

an amplifying device having an input and output that is flip-mounted to said CPW pattern such that said input and output are respectively coupled to said input and output electrodes; and wherein said CPW pattern includes at least a portion of an impedance transformation element for said amplifying device that is overlapped, at least in part, by the footprint of said flip-mounted amplifying device.

2. The amplifier of claim 1, wherein said input electrode is a gate electrode and said output electrode is a drain electrode and said amplifier further comprising a source electrode;

wherein said impedance transformation element is directly coupled to said source electrode.

3. The amplifier of claim 1, wherein the CPW pattern is configured in strip format.

4. The amplifier of claim 1, wherein said CPW pattern further comprises an impedance matching stub of adjustable length.

5. The amplifier of claim 1, further comprising a series connected inductor-resistor pair with the resistor directly coupled to one of said electrodes in such a manner that the resistor substantially serially precedes the inductor.

6. The amplifier of claim 5, further comprising means coupled through said inductor-resistor pair for providing a DC bias to said one of said electrodes.

7. The amplifier of claim 1, wherein at least one of said first and second sections of said centerline includes a resistor formed therein.

8. The amplifier of claim 1, further comprising an output stage amplifier and a transmission segment formed in said CPW pattern between said amplifying device and said output stage amplifier, said transmission segment being of a predefined length to rotate the output impedance of said amplifying device toward a low noise match with said output stage amplifier and to rotate the input impedance of said output stage amplifier toward a high gain match with said amplifying device.

9. The amplifier of claim 1, further comprising an output stage amplifier and a transmission segment formed between said amplifying device and said output stage amplifier, said transmission segment being of a predefined length to rotate the input impedance of output stage amplifier towards an impedance match for power as seen by said amplifying device.

10. The amplifier of claim 8, wherein said transmission segment includes a capacitive element.

11. The amplifier of claim 8, wherein the impedance submitted to the amplifying device is approximately $\Gamma_{opt}$.

12. An amplifier, comprising:

a substrate of electrically insulating material;

an amplifying device having an input and an output;

a CPW metalization pattern formed on said substrate including first and second signal return conductors and a center conductor having a first section that contains an input electrode and a second section, physically separated from the first section, that contains an output electrode, the input and output of said amplifying device being respectively coupled to the input and output electrodes such that said amplifying device is mounted across the physical separation between said first and second sections; and a resistive element formed within at least one of said first and second sections of said center conductor.

13. The amplifier of claim 12, wherein said resistive element is coupled to a shunt inductive element which is coupled to one of said signal return conductors for dissipating through said resistive element frequencies passed by said shunt inductive element that are outside of a predefined pass band.

14. The amplifier of claim 13, further comprising means for providing a DC bias through said shunt inductive element to one of said electrodes.

15. The amplifier of claim 12, wherein said input electrode is a gate electrode and said output electrode is a drain electrode and said CPW pattern further includes at least one source electrode coupled to one of said signal return conductors, said source electrode having an impedance transforming element coupled directly thereto.

16. The amplifier of claim 15, wherein a footprint of said amplifying device at least partially overlaps said impedance transforming element.

17. The amplifier of claim 12, wherein said CPW pattern further comprises an impedance matching stub of adjustable length.

18. An amplifier, comprising:

a substrate of electrically insulating material;

a CPW metalization pattern formed on said substrate having a center conductor and first and second signal return conductors;

first and second stage amplifiers flip-mounted to said CPW pattern; and a transmission segment formed between said first and second stages of a predefined length to rotate the output impedance of said first stage toward a low noise match with said second stage and to rotate the input impedance of said second stage toward a high gain match with said first stage.

19. The amplifier of claim 18, wherein said transmission segment includes a capacitive element.

20. The amplifier of claim 19, wherein said capacitive element is a distributed capacitor.

21. The amplifier of claim 18, wherein said center conductor includes a resistive element formed therein.

22. The amplifier of claim 21, wherein said resistive element is coupled to a shunt inductive element which is coupled to one of said signal return conductors for dissipating through said resistive element frequencies passed by said shunt inductive element that are outside of a predefined pass band.

23. The amplifier of claim 18, wherein at least a portion of an impedance transformation element for said first stage amplifier is provided in said CPW pattern such that said portion is overlapped by the footprint of said flip-counted first stage amplifier.

24. The amplifier of claim 18, wherein the impedance presented to the first stage amplifier is approximately $\Gamma_{opt}$.

25. The amplifier of claim 18, wherein said CPW pattern further comprises an impedance matching stub of adjustable length.

26. An amplifier, comprising:

a substrate of electrically insulated material;

a CPW pattern formed on said surface having at least first and second centerline sections physically separated from one another and positioned between first and second signal return conductors, said first section containing an input electrode and said second section containing an output electrode;

an amplifying device having an input and output that is flip-mounted to said CPW pattern such that said input and output are respectively coupled to said input and output electrodes; and adjustable impedance matching means formed in said CPW pattern for adjusting an impedance submitted to said amplifying device.

27. The amplifier of claim 26, wherein said adjustable impedance matching means includes an impedance matching stub of adjustable length.

28. The amplifier of claim 27, wherein said impedance matching stub includes a primary stub and at least one contact pad spaced a predefined distance therefrom, wherein connection of said primary stub to said contact pad by a conducting lead effectively increases the length of said primary stub for impedance matching purposes.

29. The amplifier of claim 26, wherein said adjustable impedance matching means adjusts an impedance submitted to said amplifying device such that said amplifying device sees an input impedance of approximately $\Gamma_{opt}$.

* * * * *